United States Patent
Deng et al.

(10) Patent No.: US 9,601,492 B1
(45) Date of Patent: Mar. 21, 2017

(54) FINFET DEVICES AND METHODS OF FORMING THE SAME

(71) Applicant: Taiwan Semiconductor Manufacturing Co., Ltd., Hsinchu (TW)

(72) Inventors: Jie-Cheng Deng, New Taipei (TW); Yi-Jen Chen, Hsinchu (TW); Horng-Huei Tseng, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 0 days.

(21) Appl. No.: 14/941,663

(22) Filed: Nov. 16, 2015

(51) Int. Cl.
| | |
|---|---|
| *H01L 27/092* | (2006.01) |
| *H01L 21/8238* | (2006.01) |
| *H01L 29/66* | (2006.01) |
| *H01L 29/06* | (2006.01) |

(52) U.S. Cl.
CPC .. *H01L 27/0924* (2013.01); *H01L 21/823807* (2013.01); *H01L 21/823821* (2013.01); *H01L 21/823878* (2013.01); *H01L 29/0653* (2013.01); *H01L 29/66545* (2013.01)

(58) Field of Classification Search
CPC .......... H01L 27/0924; H01L 29/66545; H01L 29/0653; H01L 21/823807; H01L 21/823821; H01L 21/823878
See application file for complete search history.

(56) References Cited

U.S. PATENT DOCUMENTS

| | | | |
|---|---|---|---|
| 9,076,869 B1* | 7/2015 | Hu | H01L 29/7848 |
| 9,214,358 B1* | 12/2015 | Lin | H01L 21/3115 |
| 9,219,153 B2* | 12/2015 | Xie | H01L 29/785 |
| 9,240,447 B1* | 1/2016 | Cheng | H01L 21/02639 |
| 9,287,387 B2* | 3/2016 | Fumitake | H01L 29/6681 |
| 9,293,459 B1* | 3/2016 | Cheng | H01L 27/0886 |
| 9,349,651 B2* | 5/2016 | Kim | H01L 29/66545 |
| 2014/0167120 A1* | 6/2014 | Chi | H01L 27/0886 257/288 |
| 2015/0054078 A1* | 2/2015 | Xie | H01L 29/785 257/347 |
| 2015/0145041 A1* | 5/2015 | Divakaruni | H01L 27/1211 257/347 |
| 2015/0171217 A1* | 6/2015 | Kim | H01L 29/7851 257/401 |
| 2015/0311311 A1* | 10/2015 | Fumitake | H01L 29/6681 438/587 |
| 2016/0043079 A1* | 2/2016 | Chang | H01L 27/0886 257/401 |
| 2016/0071928 A1* | 3/2016 | Xie | H01L 29/785 257/401 |

(Continued)

*Primary Examiner* — Earl Taylor
(74) *Attorney, Agent, or Firm* — Jianq Chyun IP Office

(57) ABSTRACT

FinFET devices and methods of forming the same are disclosed. One of the FinFET devices includes a substrate, multiple gates and an insulating wall. The substrate is provided with multiple fins extending in a first direction. The multiple gates extending in a second direction different from the first direction are provided respectively across the fins. Two of the adjacent gates are arranged end to end. The insulating wall extending in the first direction is located between the facing ends of the adjacent gates and is in physical contact with a gate dielectric material of each of the adjacent gates.

19 Claims, 7 Drawing Sheets

(56) References Cited

U.S. PATENT DOCUMENTS

| | | | |
|---|---|---|---|
| 2016/0079354 A1* | 3/2016 | Park | H01L 29/66545 257/386 |
| 2016/0093614 A1* | 3/2016 | Cheng | H01L 27/0886 257/401 |
| 2016/0099211 A1* | 4/2016 | Baek | H01L 27/088 257/774 |
| 2016/0111420 A1* | 4/2016 | Zhang | H01L 27/0886 257/392 |
| 2016/0126142 A1* | 5/2016 | Chen | H01L 21/3115 438/283 |
| 2016/0133632 A1* | 5/2016 | Park | H01L 27/1104 257/369 |
| 2016/0181366 A1* | 6/2016 | Oh | H01L 21/845 257/77 |

* cited by examiner

FINFET DEVICES AND METHODS OF FORMING THE SAME

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs.

Such scaling down has also increased the complexity of processing and manufacturing ICs and, for these advances to be realized, similar developments in IC processing and manufacturing are needed. For example, a three dimensional transistor, such as a fin-type field-effect transistor (FinFET), has been introduced to replace a planar transistor. Although existing FinFET devices and methods of forming FinFET devices have been generally adequate for their intended purposes, they have not been entirely satisfactory in all respects. For example, it is rather difficult to fill an insulating material between closely adjacent gates without generation of a void, and thus the performance of the FinFET devices is decreased. It is desired to have improvements in this area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
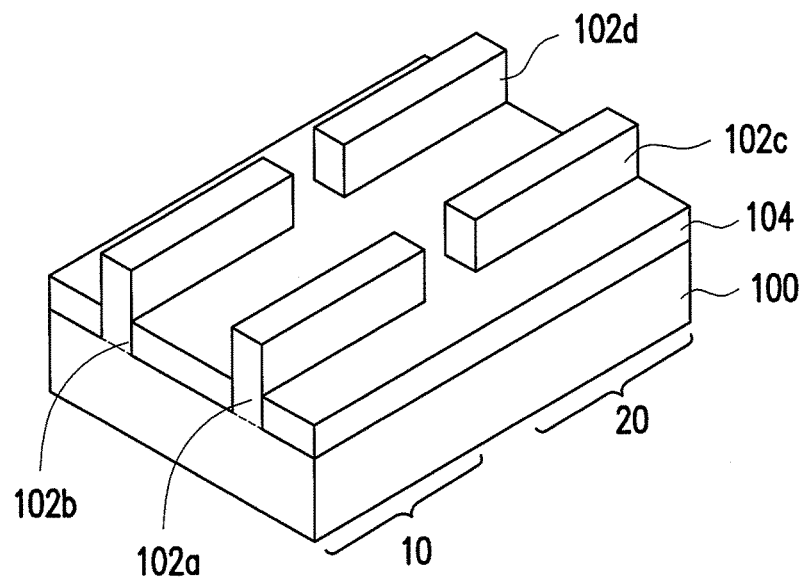
FIG. 1A to FIG. 1H are schematic perspective views of a method of forming a FinFET device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1A to FIG. 1H are schematic perspective views of a method of forming a FinFET device in accordance with some embodiments.

Referring to FIG. 1A, a substrate 100 with multiple separate fins 102a to 102d thereon is provided. In some embodiments, the substrate 100 is a semiconductor substrate, such as a silicon substrate, a silicon-on-insulator (SOI) substrate, a silicon germanium substrate, or a substrate formed of other suitable semiconductor materials. In some embodiments, the substrate 100 has a first region 10 and a second region 20 adjacent to each other. In some embodiments, the first region 10 is an N-type metal-oxide-semiconductor (NMOS) region, and the second region 20 is a P-type metal-oxide-semiconductor (PMOS) region. In alternative embodiments, the first region 10 is a PMOS region, and the second region 20 is an NMOS region.

In some embodiments, the fins 102a to 102d extend in a first direction. In some embodiments, the fins 102a to 102d and the substrate 100 are made of the same material, such as silicon. In alternative embodiments, the fins 102a to 102d include a material different from that of the substrate 100. For example, the fins 102a to 102d include silicon germanium and the substrate 100 includes silicon.

In some embodiments, at least one fin 102a and at least one fin 102b are provided in the first region 10, and at least one fin 102c and at least one fin 102d are provided in the second region 20. Specifically, the fins 102a and 102b are disposed in parallel and their ends thereof are aligned to one another in the first region 10, and the fins 102c and 102d are disposed in parallel and their ends thereof are aligned to one another in the second region 20.

In some embodiments, the fin 102a and fin 102c are arranged end to end along the first direction, and the fin 102b and fin 102d are arranged end to end along the same direction. Specifically, one end of the at least fin 102a is faced to the corresponding end of the at least one fin 102c, and one end of the at least fin 102b is faced to the corresponding end of the at least one fin 102d.

Still referring to FIG. 1A, the substrate 100 further has an isolation layer 104 formed thereon. In some embodiments, the isolation layer 104 covers lower portions of the fins 102a to 102d and exposes upper portions of the fins 102a to 102d. In some embodiments, the isolation layer 104 is a shallow trench isolation (STI) structure. The isolation layer 104 includes a dielectric material such as silicon oxide. The fins 102a to 102d and the isolation layer 104 may be formed using various suitable methods available in the art, such as a spacer double patterning technique (SDPT).

Figure 1B:
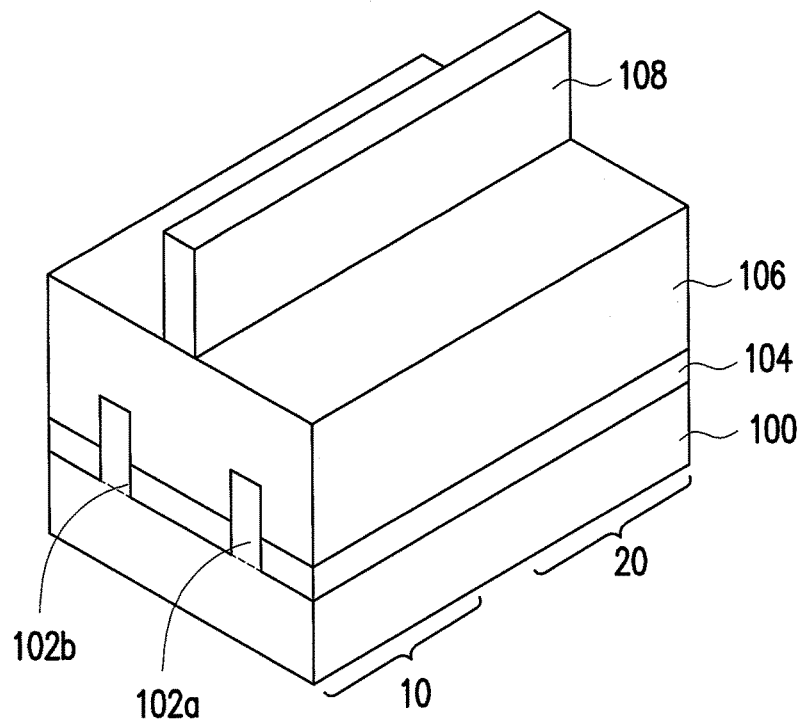
Figure 1C:
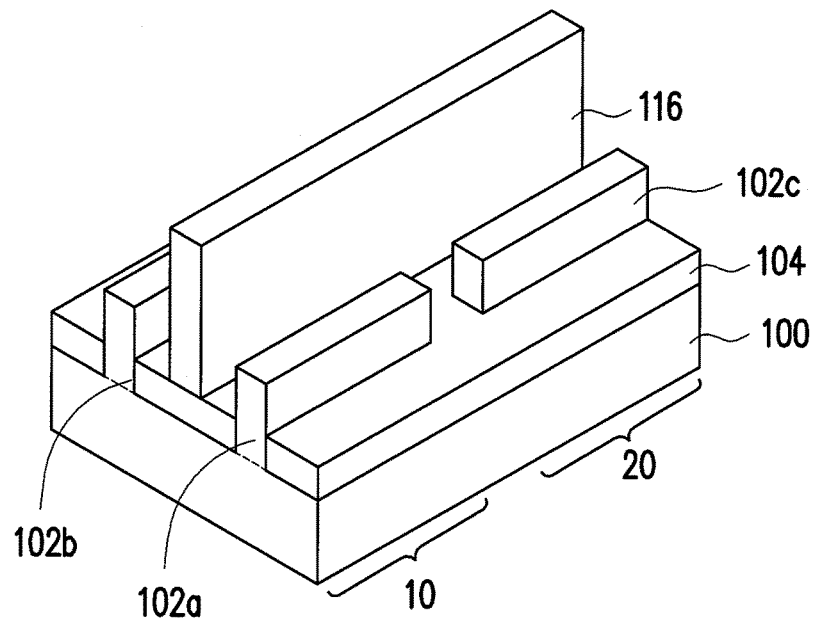

Referring to FIG. 1B to FIG. 1C, an insulating wall 116 is formed between and parallel to the fins 102a to 102d. In some embodiments, an insulating layer 106 is formed on the isolation layer 104 covering the fins 102a to 102d, as shown in FIG. 1B. In some embodiments, the insulating layer 106 includes silicon oxide, silicon nitride, silicon oxynitride, silicon carbide, copper oxide, nickel oxide, zinc oxide, lanthanum manganese oxide, lanthanum copper oxide or a combination thereof. In some embodiments, the insulating layer 106 is made of a single material. In alternative embodiments, the insulating layer 106 includes multiple horizontal films sequentially stacked on the isolation layer 104. The insulating layer 106 is formed by a suitable process such as physical vapor deposition (PVD), sputtering, chemical vapor deposition (CVD), atomic layer deposition (ALD), or a combination thereof.

Thereafter, a mask layer 108 is formed on the insulating layer 106. In some embodiments, the mask layer 108 includes a photo-sensitive material such as a positive photoresist or a negative photoresist. In alternative embodiments, the mask layer 108 is a tri-layer photoresist including a bottom layer, a middle layer such as a silicon containing hard-mask layer above the bottom layer, and a photoresist layer above the middle layer. A pattern formed in the photoresist layer is sequentially transferred to the middle layer, then to the bottom layer, and therefore defines an underlying target pattern. In yet alternative embodiments, the mask layer 108 includes a dielectric material having an etching selectivity different from that of the insulating layer 106. For example, the etching selectivity of the insulating layer 106 to the mask layer 108 is greater than about 5. In some embodiments, the mask layer 108 is formed by a photolithography process. In alternative embodiments, the mask layer 108 is formed by a suitable process such as spin-coating, PVD, CVD, ALD or a combination thereof, and followed by photolithography etching processes.

Thereafter, a portion of the insulating layer 106 is removed by using the mask layer 108 as an etching mask, so as to form an insulating wall 116 parallel to the fins 102a to 102d, as shown in FIG. 1C. The removing step includes a dry etching process. In some embodiments, the insulating wall 116 traverses the first and second regions 10 and 20 such as NMOS and PMOS regions. Specifically, the insulating wall 116 extends in a direction (e.g. the first direction) the same as that of the fins 102a to 102d, and is disposed between the fins 102a and 102b and between the fins 102c and 102d.

Figure 1D:
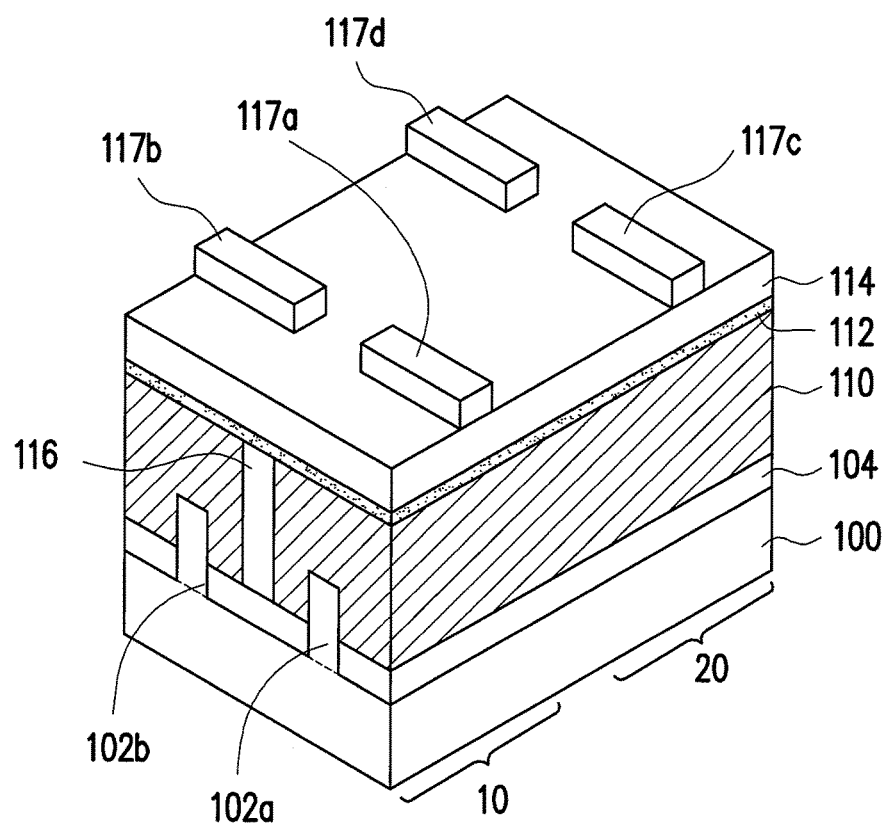

Referring to FIG. 1D, a dummy layer 110 is formed around the fins 102a to 102d and the insulating wall 116. In some embodiments, the dummy layer 110 includes a silicon-containing material such as polysilicon or amorphous silicon. The method of forming the dummy layer 110 includes performing a suitable process such as PVD, CVD or ALD and followed by a planarization process such as chemical mechanical polishing (CMP) or etching back. In some embodiments, the surface of the dummy layer 110 is substantially coplanar with the surface of the insulating wall 116. Specifically, the dummy layer 110 covers the fins 102a to 102d and exposes the top surface of the insulating wall 116.

Thereafter, an etch stop layer 112 is formed on the surface of the dummy layer 110 and the exposed top surface of the insulating wall 116. The etch stop layer 112 includes silicon nitride or titanium nitride and is formed by a suitable process such as PVD, CVD, ALD or the like.

Afterwards, a capping layer 114 is formed on the etch stop layer 112. In some embodiments, the capping layer 114 is an insulating layer including silicon oxide, silicon nitride, silicon oxynitride, silicon carbide, copper oxide, nickel oxide, zinc oxide, lanthanum manganese oxide, lanthanum copper oxide or a combination thereof. In some embodiments, the capping layer 114 includes a material the same as that of the insulating wall 116. In alternative embodiments, the capping layer 114 and the insulating wall 116 are made of different materials. In some embodiments, the capping layer 114 is a bottom layer or a photoresist layer.

The photoresist patterns 117a to 117d are then formed over the capping layer 114. In some embodiments, the photoresist patterns 117a to 117d extend in a second direction different from the first direction. In some embodiments, each of the photoresist patterns 117a to 117d is a tri-layer photoresist including a bottom layer such as a carbon/oxygen-containing layer, a middle layer such as a hard-mask layer above the bottom layer and a photoresist layer above the middle layer. In some embodiments, the photoresist patterns 117a to 117d are formed by a suitable process such as spin-coating, PVD, CVD, ALD or a combination thereof, and followed by photolithography etching processes.

Figure 1E:
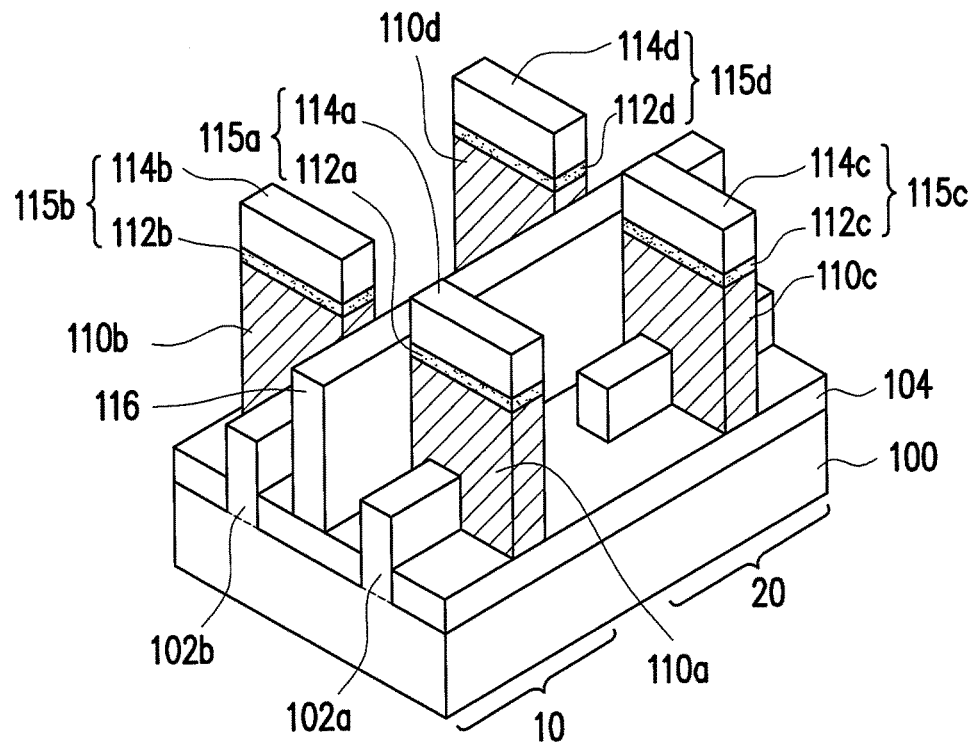

Referring to FIG. 1E, portions of the capping layer 114 and the etch stop layer 112 are removed by using the photoresist patterns 117a to 117d as an etching mask, so as to sequentially transfer the patterns of the photoresist patterns 117a to 117d to the underlying layers. The pattern transferring step includes performing at least one dry etching process.

In some embodiments, upon the pattern transferring step, the top surface of the insulating wall 116 is exposed, and mask patterns 115a to 115d are provided on the dummy layer 110. In some embodiments, the mask pattern 115a includes a capping pattern 114a and an etch stop pattern 112a, the mask pattern 115b includes a capping pattern 114b and an etch stop pattern 112b, the mask pattern 115c includes a capping pattern 114c and an etch stop pattern 112c, and the mask pattern 115d includes a capping pattern 114d and an etch stop pattern 112d.

Still referring to FIG. 1E, a portion of the dummy layer 110 is removed by using the mask patterns 115a to 115d and the insulating wall 116 as an etching mask, and thus, dummy gates 110a to 110d are formed on the isolation layer 104 below the corresponding mask patterns 115a to 115d. The dummy gates 110a to 110d are formed respectively across the fins 102a to 102d. In some embodiments, the dummy gates 110a to 110d extend in a direction different from (e.g., perpendicular to) the extending direction of the fins 102a to 102d.

In some embodiments, the dummy gates 110a and 110b in the first region 10 are arranged end to end and beside the insulating wall 116, and the dummy gates 110c and 110d in the second region 20 are arranged end to end and beside the insulating wall 116. In some embodiments, the facing ends of the dummy gates 110a and 110b are in physical contact with the insulating wall 116, and the facing ends of the dummy gates 110c and 110d are in physical contact with the insulating wall 116. Thereafter, the mask patterns 115a to 115d are removed through a suitable technique such as a dry etching process, a wet etching process or a combination thereof.

Figure 1F:
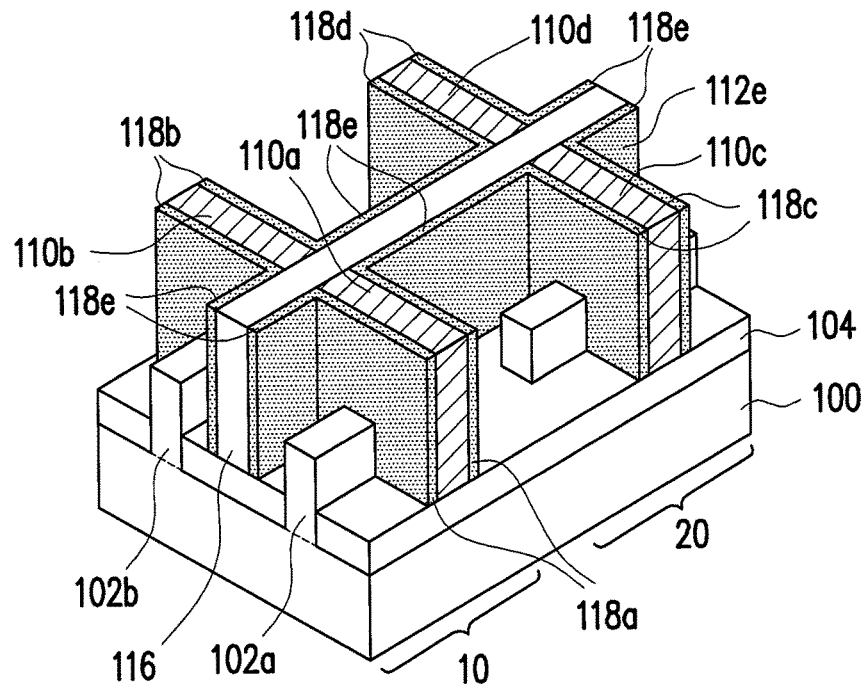

Referring to FIG. 1F, spacers are formed beside each of the dummy gates 110a to 110d and the insulating wall 116. In some embodiments, a spacer material layer is formed on the isolation layer 104 covering the dummy gates 110a to 110d and the insulating wall 116, and an anisotropic etching process is performed to remove a portion of the spacer material layer. Upon the anisotropic etching process, spacers 118a to 118d extending in the second direction are formed respectively on the sidewalls of the dummy gates 110a to 110d, and spacers 118e extending in the first direction are formed on the sidewalls of insulating wall 116. Specifically, the spacers 118a are formed on opposite sidewalls the dummy gate 110a, the spacers 118b are formed on opposite sidewalls the dummy gate 110b, the spacers 118c are formed on opposite sidewalls the dummy gate 110c, and the spacers 118d are formed on opposite sidewalls the dummy gate 110d. Besides, the spacers 118e are formed on opposite sidewalls the insulating wall 116. In some embodiments, a portion of the spacers 118e is disposed between the dummy gates 110a and 110c and is connected to portions of the spacers 118a and 118c to form a U-shaped spacer, and another portion of the spacers 118e is disposed between the dummy gates 110b and 110d and is connected to portions of the spacers 118b and 118d to form another U-shaped spacer.

It is noted that, since the dummy gates 110a to 110d are formed to connect the insulating wall 116, none of the said spacers 118a to 118e is present between the insulating wall 116 and each of the dummy gates 110a to 110d.

In some embodiments, the spacers 118a to 118e include silicon oxide, silicon nitride, silicon oxynitride or a combination thereof. In some embodiments, the spacers 118a to 118e are made of a single material different from the material of the insulating wall 116. In alternative embodiments, each of the spacers 118a to 118e is a multi-layer structure.

Figure 1G:
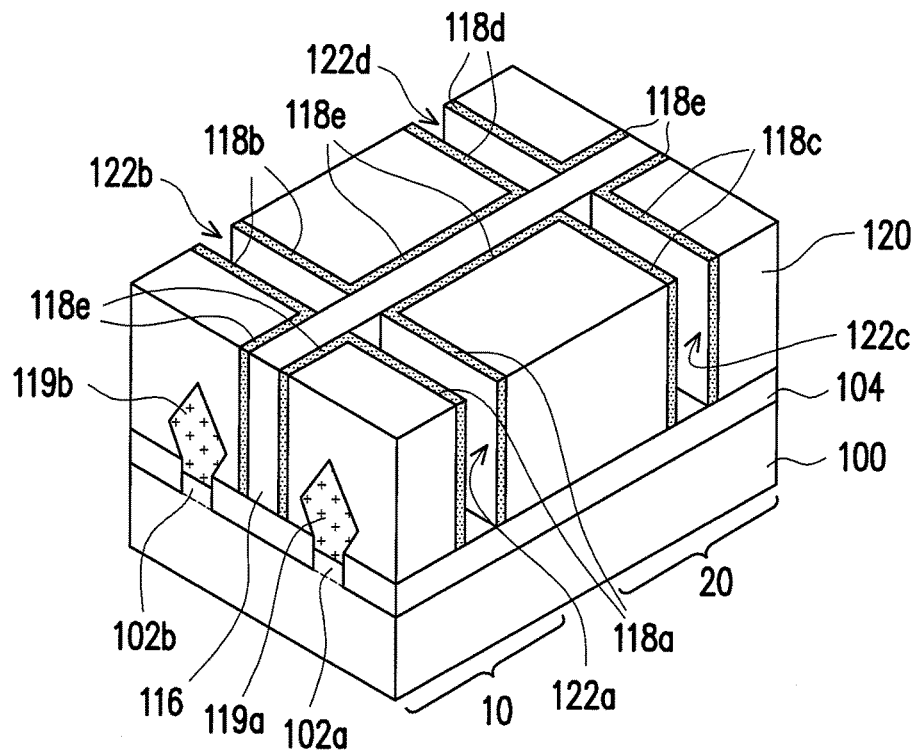

Referring to FIG. 1G, epitaxy regions 119a to 119d as source/drain regions are formed at both sides of the corresponding fins 102a to 102d. In some embodiments, the exposed upper portions of the fins 102a to 102d are removed by using a suitable technique such as an anisotropic etching process, and therefore, recesses are formed in the isolation layer 104. Thereafter, epitaxy regions 119a to 119d are formed by selectively growing epitaxy layers from the recesses. In some embodiments, the epitaxy regions 119a to 119d include silicon germanium, silicon carbon or silicon phosphate. In some embodiments, when the first region 10 is an NMOS region and the second region 20 is a PMOS region, the epitaxy regions 119a and 119b include silicon germanium and the epitaxy regions 119c and 119d include silicon carbon or silicon phosphate. In alternative embodiments, when the first region 10 is a PMOS region and the second region 20 is an NMOS region, the epitaxy regions 119a and 119b include silicon carbon or silicon phosphate and the epitaxy regions 119c and 119d include silicon germanium. In some embodiments, the epitaxy regions 119a to 119d may be optionally implanted with an N-type dopant or a P-type dopant as needed. Following the formation of epitaxy regions 119a to 119d, silicide regions (not shown) may be formed by siliciding the top portions of epitaxy regions 119a to 119d.

Still referring to FIG. 1G, a dielectric layer 120 is formed around the dummy gates 110a to 110d and the insulating wall 116. The dielectric layer 120 includes carbon-containing oxides, silicate glass, or a suitable dielectric material. In some embodiments, the dielectric layer 120 is made of a single material. In alternative embodiments, the dielectric layer 120 includes a multi-layer structure. The dielectric layer 120 may be filled until its top surface is higher than the top surfaces of dummy gates 110a to 110d. A planarization step such as CMP is then performed to remove excess dielectric layer 120. In some embodiments, the dummy gates 110a to 110d are used as a polish stop layer, so that the top surface of the dielectric layer 120 is substantially level with the top surfaces of dummy gates 110a to 110d.

Thereafter, the dummy gates 110a to 110d are removed to form trenches 122a to 122d in the dielectric layer 120. The removing step includes a suitable etching process. In some embodiments, each of the trenches 122a to 122d exposes a portion of the insulating wall 116.

Figure 1H:
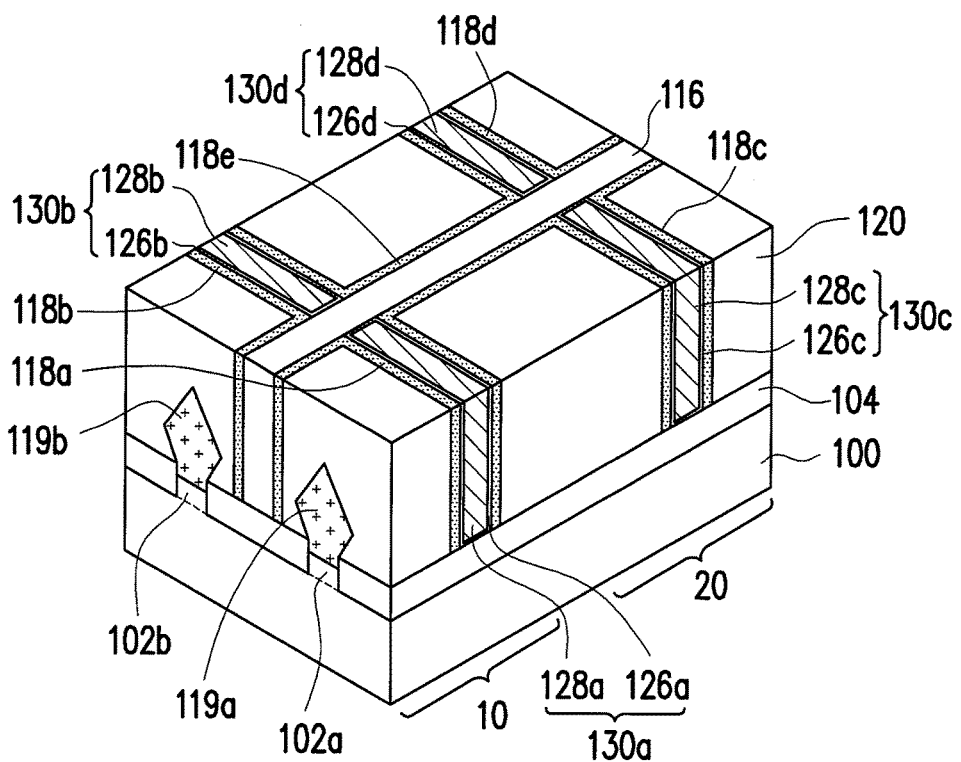

Referring to FIG. 1H, gates 130a to 130d (or called "replacement gates") are formed in the trenches 122a to 122d. In some embodiments, the gate 130a includes a gate dielectric layer 126a formed on the sidewall and bottom of the trench 122a and on the top and sidewall of the fin 102a, and a metal layer 128a filling the remaining trench 122a. Similarly, the gate 130b includes a gate dielectric layer 126b formed on the sidewall and bottom of the trench 122b and on the top and sidewall of the fin 102b, and a metal layer 128b filling the remaining trench 122b. The gate 130c includes a gate dielectric layer 126c formed on the sidewall and bottom of the trench 122c and on the top and sidewall of the fin 102c, and a metal layer 128c filling the remaining trench 122c. The gate 130d includes a gate dielectric layer 126d formed on the sidewall and bottom of the trench 122d and on the top and sidewall of the fin 102d, and a metal layer 128d filling the remaining trench 122d.

In some embodiments, each of the gate dielectric layers 126a to 126d is in physical contact with a portion of the insulating wall 116. In some embodiments, the gate dielectric layers 126a to 126d include a material different from that of the insulating wall 116. The gate dielectric layers 126a to 126d include silicon oxide, silicon oxynitride, a dielectric material having a dielectric constant greater than 7 (referred to as "a high-k material" throughout the description), or a combination thereof. In some embodiments, the high-k material includes metal oxide such as HfO, LaO, AlO, ZrO, TiO, $Ta_2O_5$, $Y_2O_3$, STO, BTO, BaZrO, HfZrO, HfLaO, HfTaO, HfTiO, a combination thereof, or a suitable material. In alternative embodiments, the high-k material can optionally include a silicate such as HfSiO, LaSiO, AlSiO, a combination thereof, or a suitable material. The method of forming the gate dielectric layers 126a to 126d includes performing molecular-beam deposition (MBD), CVD, ALD, PVD, or the like. In some embodiments, an oxide layer such as a silicon oxide layer may be formed between the high-k material and each of the fins 102a to 102d through a thermal oxidation process.

In some embodiments, each of the metal layers 128a to 128d includes TiN, TaC, TaN, TaSiN, HfN, $ZrSi_2$, $MoSi_2$, $TaSi_2$, $NiSi_2$, WN or the like. In some embodiments, when the first region 10 is an NMOS region and the second region 20 is a PMOS region, the metal layers 128a and 128b include an N-type work function metal material and the metal layers 128c and 128d include a P-type work function metal material. In alternative embodiments, when the first region 10 is a PMOS region and the second region 20 is an NMOS region, the metal layers 128a and 128b include a P-type work function metal material and the metal layers 128c and 128d include an N-type work function metal material. The metal layers 128a to 128d are formed by various deposition techniques such as CVD, PVD, sputtering, plating or the like. The FinFET device of the disclosure is thus completed.

Figure 2:
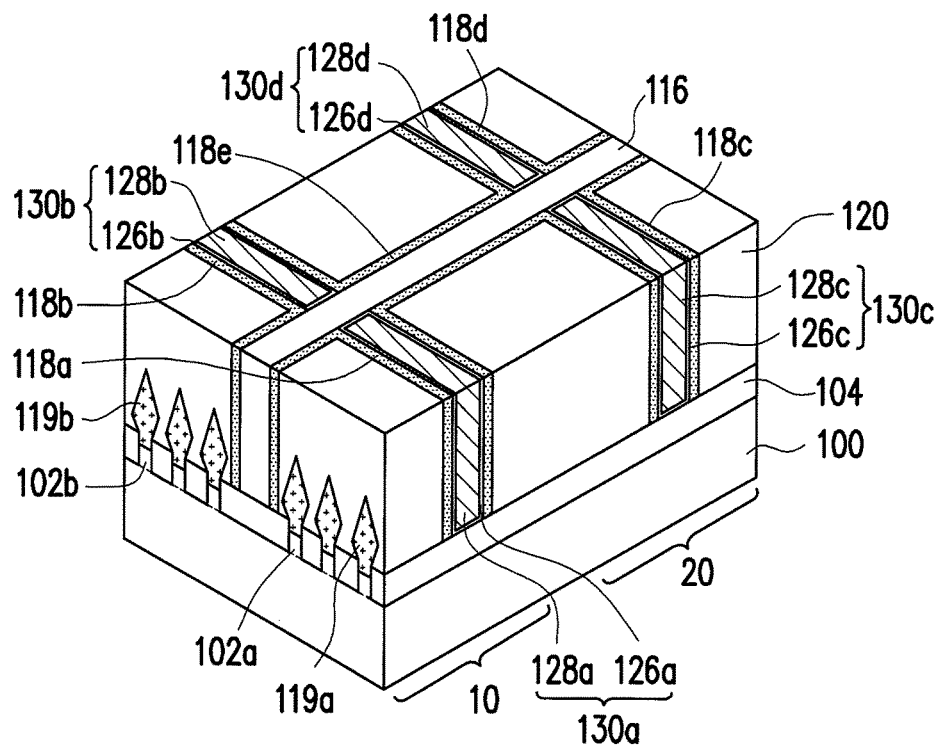
FIG. 2 and FIG. 3 are schematic perspective views of FinFET devices in accordance with alternative embodiments.

In the said embodiments, each gate is formed across a single fin, as shown in FIG. 1H. However, the disclosure is not limited thereto. In some embodiments, multiple fins can be provided as needed. For example, the gate 130a is formed across multiple fins 102a, the gate 130b is formed across multiple fins 102b, the gate 130c is formed across multiple fins 102c, and the gate 130d is formed across multiple fins 102d, as shown in FIG. 2.

Figure 3:
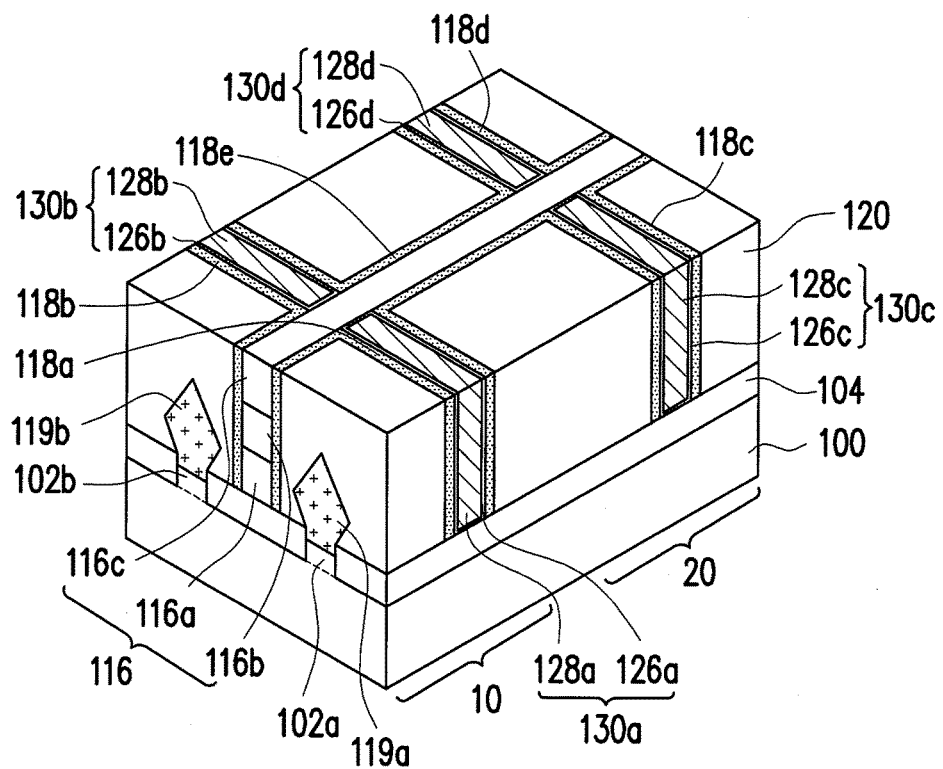

The said embodiments in which the insulating wall 116 is made of a single material are provided for illustration purposes, and are not construed as limiting the present disclosure. It is appreciated by people having ordinary skill in the art that the insulating wall 116 can be a multi-layer structure upon the process requirements. In some embodiments, the insulating wall 116 includes, from bottom to top, horizontally stacked layers 116a to 116c, as shown in FIG. 3. Each of the stacked layers 116a to 116c includes silicon oxide, silicon nitride, silicon oxynitride, silicon carbide, copper oxide, nickel oxide, zinc oxide, lanthanum manganese oxide, lanthanum copper oxide or a combination thereof. In some embodiments, the horizontally stacked layers 116a to 116c may provide a gradient stress distribution to relax the film stress. The number of the horizontally stacked layers is not limited by the disclosure.

In some embodiments, the insulating wall 116 has a width of about 1 to 60 angstroms and a height of about 10 to 500 angstroms. In some embodiments, each of the horizontally stacked layers 116a to 116c has a width of about 1 to 60 angstroms and a height of about 10 to 500 angstroms.

In the disclosure, an insulating wall 116 is formed and embedded before end-to-end gates (e.g. dummy gates or metal gates) are defined, so as to effectively solve the conventional poor isolation issue. In the conventional method, a spacer is formed surrounding four sides of each of the end-to-end dummy gates and a dielectric layer is then filled in the gap opening between the dummy gates. In such case, the pre-deposit layers such as spacers may narrow the gap opening, and therefore voids are generated in the gap opening between the dummy gates. However, such voids are not observed in the present disclosure. Specifically, an insulating wall of the disclosure is formed and embedded before the formation of the end-to-end dummy gates, and thus, narrowing of the gap opening caused by the pre-layer deposition or formation can be avoided. In other words, the conventional spacers on facing ends of the end-to-end dummy gates are not present in the present disclosure.

The structures of the FinFET devices of the disclosure are described with reference to FIG. 1H, FIG. 2 and FIG. 3.

In some embodiments, as shown in FIG. 1H, FIG. 2 and FIG. 3, the FinFET device includes a substrate 100, gates 130a to 130d and an insulating wall 116. The substrate 100 has at least one fin 102a and at least one fin 102b in a first region 10 and at least one fin 102c and at least one fin 102d in a second region 20. The fins 102a to 102d are parallel to each other and extend in a first direction. In some embodiments, one of the first and second regions 10 and 20 is an NMOS region and the other of the first and second regions 10 and 20 is a PMOS region.

The gate 130a is disposed on the isolation layer 104 and across the at least one fin 102a. The gate 130b is disposed on the isolation layer 104 and across the at least one fin 102b. The gate 130c is disposed on the isolation layer 104 and across the at least one fin 102c. The gate 130d is disposed on the isolation layer 104 and across the at least one fin 102d. The gates 130a to 130d are parallel to each other and extend in a second direction different from the first direction. Besides, ends of the gates 130a and 130b are faced to each other, and ends of the gates 130c and 130d are faced to each other. In some embodiments, the gates 130a to 130d are metal gates.

The insulating wall 116 is located between and in contact with the ends of the gates 130a and 130b, and between and in contact with the ends of the gates 130c and 130d. Specifically, the continuous and void-free insulating wall 116 is located between the ends of the gates 130a and 130b and is in physical contact with gate dielectric layers 126a and 126b of the gates 130a and 130b, and between the ends of the gates 130c and 130d and is in physical contact with gate dielectric layers 126c and 126d of the gates 130c and 130d. The insulating wall 116 extends in the first direction and traverses the first and second regions 10 and 20 such as NMOS and PMOS regions. In some embodiments, the insulating layer 116 is made of a single material, as shown in FIG. 1H and FIG. 2. In alternative embodiments, the insulating layer 116 includes horizontally stacked layers 116a to 116c, as shown in FIG. 3.

The FinFET structure of the disclosure further includes a dielectric layer 120. The dielectric layer 120 is formed surrounding or around the gates 130a to 130d and the insulating wall 116. In some embodiments, the material of the insulating wall 116 is different from that of the dielectric layer 120. In alternative embodiments, the insulating wall 116 and the dielectric layer 120 include the same material.

The FinFET structure of the disclosure further includes spacers 118a to 118e. The spacers 118a are disposed beside the gate 130a. The spacers 118b are disposed beside the gate 130b. The spacers 118c are disposed beside the gate 130c. The spacers 118d are disposed beside the gate 130d. The spacers 118e are disposed beside the insulating wall 116. Besides, the spacers 118a to 118d and the gates 130a and 130d extend in one direction, and the spacers 118e and the insulating wall 116 extend in another direction different from the one direction.

The said embodiments in which the insulating wall 116 is applied to isolate the end-to-end gates are provided for illustration purposes, and are not construed as limiting the present disclosure. In some embodiment, the insulating wall can be applied not only to isolate the end-to-end gates, but also to isolate the adjacent active regions from each other.

Figure 4A:
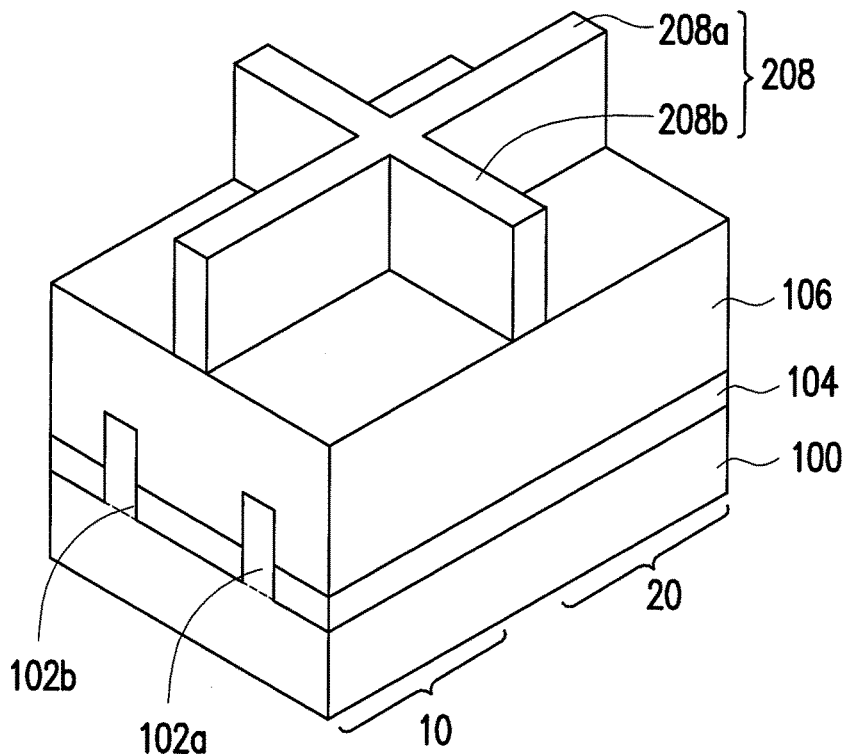
FIG. 4A to FIG. 4C are schematic perspective views of a method of forming a FinFET device in accordance with yet alternative embodiments.
Figure 4B:
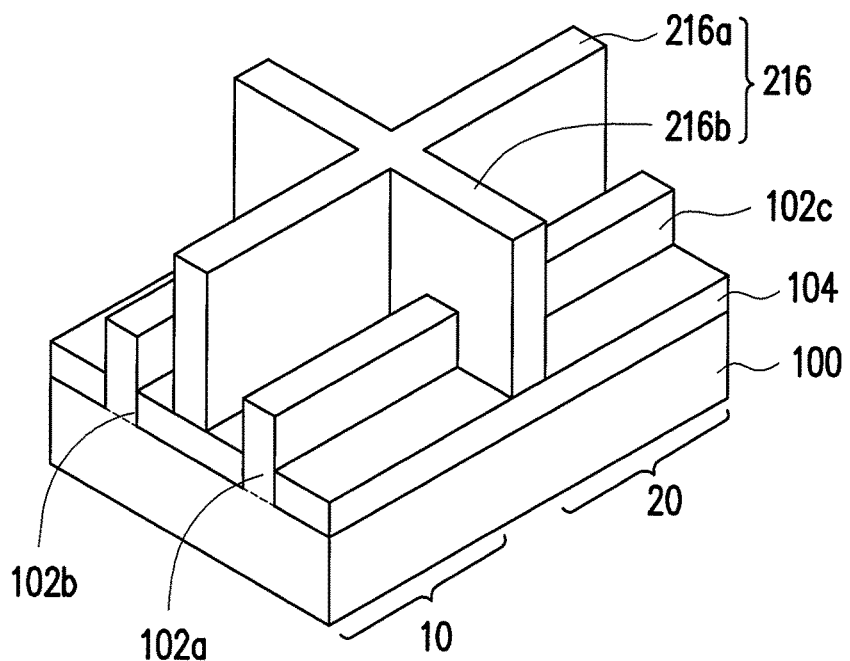
Figure 4C:
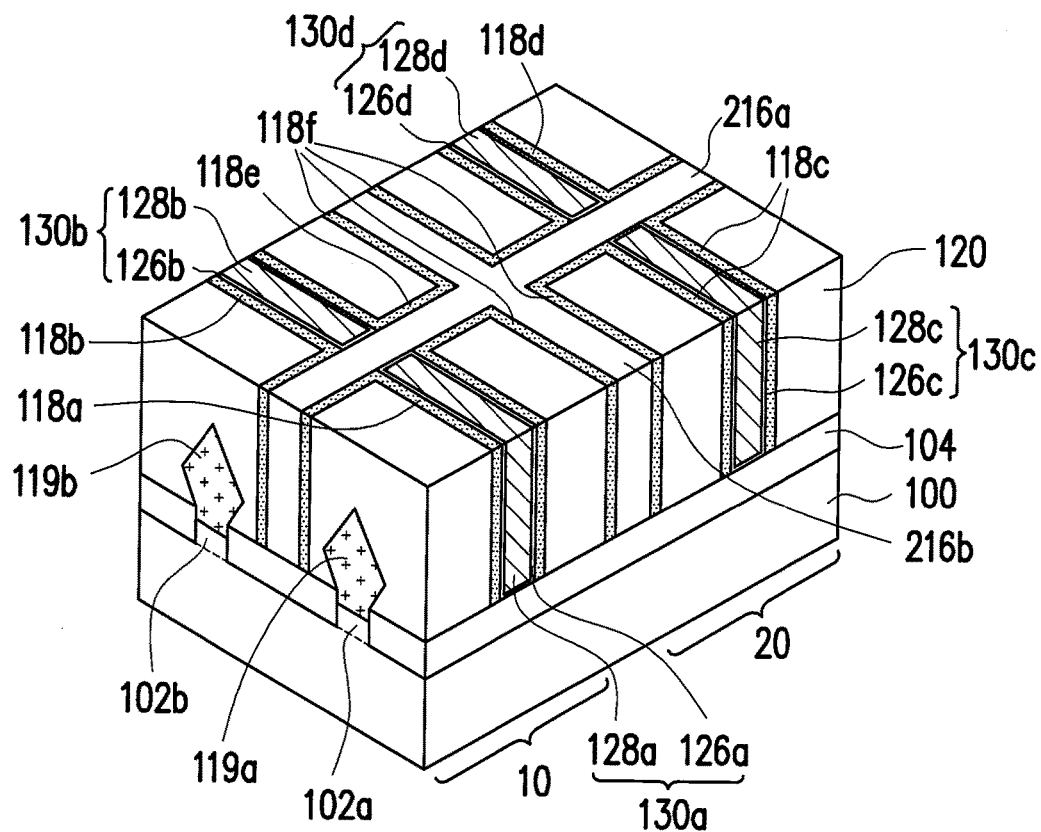

FIG. 4A to FIG. 4C are schematic perspective views of a method of forming a FinFET device in accordance with yet alternative embodiments.

The method of the FIG. 4A to FIG. 4C is similar to that of the FIG. 1A to FIG. 1H, and the difference lies in the shapes of the insulating walls. Specifically, the insulating wall 116 in the method of FIG. 1A to FIG. 1H is a stripe-shaped pattern, while the insulating wall 216 in the method of FIG. 4A to FIG. 4C is a cross-shaped pattern.

Referring to FIG. 4A, provided is a substrate 100 having fins 102a to 102d thereon and having an isolation layer 104 formed to cover lower portions of the fins 102a to 102d. In some embodiments, the fins 102a and 102b are provided in a first region 10 and the fins 102c and 102d are provided in a second region 20 adjacent to the first region 10.

Thereafter, an insulating layer 106 is formed on the substrate 100 covering the fins 102a to 102d. A mask layer 208 is then formed on the insulating layer 106. In some embodiments, the mask layer 208 includes a first mask layer 208a extending in a first direction and a second mask layer 208b extending in a second direction different from the first direction.

Referring to FIG. 4B, a portion of the insulating layer 104 is removed by using the mask layer 208 as an etching mask, and thus, an insulating wall 216 is formed on the isolation layer 104. The insulating wall 216 includes a first insulating wall 216a extending in the first direction and a second insulating wall 216b extending in the second direction. In some embodiments, the first insulating wall 216a is formed across the first and second regions 10 and 20, and the second insulating wall 216b is formed between the first and second regions 10 and 20. Specifically, the first insulating wall 216a is provided to isolate the end-to-end gates, and the second insulating wall 216b is provided to isolate the adjacent active regions.

Referring to FIG. 4C, the steps similar to FIG. 1D to FIG. 1H are performed, gates 130a to 130d are formed respectively across the fins 102a to 102d. The FinFET device of the disclosure is thus completed. In some embodiments, spacers 118f is further included in the FinFET device in FIG. 4C. In some embodiments, the spacers 118e is formed on opposite sidewalls the first insulating wall 216a, and the spacers 118f is formed on opposite sidewalls the second insulating wall 216b. The spacers 118f and the gates 130a to 130d extend in the same direction.

In the said embodiments, the method of the disclosure is applied to a "high-k last" FinFET device process, and the insulating wall is in contact with the gate dielectric materials of the end-to-end metal gates. However, the present disclosure is not limited thereto. In some embodiments, when the method of the disclosure is applied to a "high-k first" FinFET device process, the insulating wall is formed to be in contact with the metal materials of the end-to-end metal gates. In alternative embodiments, when the method of the disclosure is applied to a planar device process, the insulating wall is formed to be in contact with the end-to-end silicon-containing gates.

In summary, the present disclosure provides a novel manufacturing process to solve the line-to-line, end-to-end and/or device-to-device poor isolation issue when the device size shrinks to 7 nm or beyond. Specifically, an insulating wall is formed and embedded before a transistor is defined or a conductive line process is formed, and thus, narrowing of the gap opening caused by the pre-layer deposition or formation can be avoided, and the performance of the device can be effectively improved.

In accordance with some embodiments of the present disclosure, a FinFET device includes: a substrate having at least one first fin and at least one second fin extending in a first direction; a first gate extending in a second direction different from the first direction and across the at least one first fin; a second gate extending in the second direction and across the at least one second fin, wherein ends of the first and second gates are faced to each other; and an insulating wall extending in the first direction, located between the ends of the first and second gates and in physical contact with a gate dielectric material of each of the first and second gates.

In accordance with alternative embodiments of the present disclosure, a method of forming a FinFET device includes at least the following steps. Provided is a substrate having at least one first fin and at least one second fin thereon and having an isolation layer formed to cover lower portions of the at least one first fin and the at least one second fin. An insulating wall is formed between and parallel to the at least one first fin and the at least one second fin. First and second dummy gates are formed respectively across the at least one first fin and the at least one second fin, wherein the first and second dummy gates are arranged end to end and beside the insulating wall. A dielectric layer is formed around the first and second dummy gates and the insulating wall. The first and second dummy gates are removed to form first and second trenches in the dielectric layer. First and second gates are formed in the first and second trenches.

In accordance with yet alternative embodiments of the present disclosure, a FinFET device includes: a substrate having first and second fins in a first region and third and fourth fins in a second region; first and second gates respectively across the first and second fins, wherein ends of the first and second gates are faced to each other; third and fourth gates respectively across the third and fourth fins, wherein ends of the third and fourth gates are faced to each other; a continuous insulating wall located between and in contact with the ends of the first and second gates and located between and in contact with the ends of the third and fourth gates; and a dielectric layer around the first to fourth gates and the insulating wall, wherein a material of the insulating wall is different from a material of the dielectric layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A FinFET device, comprising:
   a substrate having at least one first fin and at least one second fin extending in a first direction;
   a first gate extending in a second direction different from the first direction and across the at least one first fin;
   a second gate extending in the second direction and across the at least one second fin, wherein ends of the first and second gates are faced to each other; and
   an insulating wall extending in the first direction, located between the ends of the first and second gates and in physical contact with a gate dielectric material of each of the first and second gates,
   wherein the insulating wall traverses an NMOS region and a PMOS region.

2. The FinFET device of claim 1, wherein the insulating wall comprises silicon oxide, silicon nitride, silicon oxynitride, silicon carbide, copper oxide, nickel oxide, zinc oxide, lanthanum manganese oxide, lanthanum copper oxide or a combination thereof.

3. The FinFET device of claim 1, wherein the gate dielectric material comprises a dielectric material with a dielectric constant greater than 7.

4. The FinFET device of claim 1, further comprising:
   first spacers, disposed beside the first gate;
   second spacers, disposed beside the second gate; and
   third spacers, disposed beside the insulating wall.

5. The FinFET device of claim 1, wherein each of the first and second gates comprises metal.

6. The FinFET device of claim 1, wherein the at least one first fin comprises multiple first fins and the first gate is across the multiple first fins, and the at least one second fin comprises multiple second fins and the second gate is across the multiple second fins.

7. A method of forming a FinFET device, comprising:
   providing a substrate having at least one first fin and at least one second fin thereon and having an isolation layer formed to cover lower portions of the at least one first fin and the at least one second fin;
   forming an insulating wall between and parallel to the at least one first fin and the at least one second fin;
   forming first and second dummy gates respectively across the at least one first fin and the at least one second fin, wherein the first and second dummy gates are arranged end to end and beside the insulating wall;
   forming a dielectric layer around the first and second dummy gates and the insulating wall;
   removing the first and second dummy gates to form first and second trenches in the dielectric layer; and forming first and second gates in the first and second trenches.

8. The FinFET device of claim 7, wherein the step of forming the insulating wall comprises:
   forming an insulating layer on the substrate covering the at least one first fin and the at least one second fin;
   forming a mask layer on the insulating layer; and
   etching a portion of the insulating layer by using the mask layer as an etching mask.

9. The method of claim 8, wherein the mask layer comprises a photoresist material.

10. The method of claim 7, wherein the step of forming first and second dummy gates comprises:
    forming a dummy layer around the at least one first, the at least one second fin and the insulating wall;
    forming mask patterns on the dummy layer; and
    etching a portion of dummy layer by using the mask patterns and the insulating wall as an etching mask.

11. The method of claim 10, the dummy layer comprises a silicon-containing material.

12. The method of claim 7, further comprising, after the step of forming the first and second dummy gates and before the step of forming the dielectric layer,
    forming first spacers beside the first dummy gate;
    forming second spacers beside the second dummy gate; and
    forming third spacers beside the insulating wall.

13. The method of claim 7, wherein the insulating wall comprises silicon oxide, silicon nitride, silicon oxynitride, silicon carbide, copper oxide, nickel oxide, zinc oxide, lanthanum manganese oxide, lanthanum copper oxide or a combination thereof.

14. The method of claim 7, wherein the insulating wall traverses an NMOS region and a PMOS region.

15. A FinFET device, comprising:
    a substrate having first and second fins in a first region and third and fourth fins in a second region;
    first and second gates respectively across the first and second fins, wherein ends of the first and second gates are faced to each other;
    third and fourth gates respectively across the third and fourth fins, wherein ends of the third and fourth gates are faced to each other;
    a continuous insulating wall located between and in contact with the ends of the first and second gates and located between and in contact with the ends of the third and fourth gates; and
    a dielectric layer around the first to fourth gates and the continuous insulating wall, wherein a material of the continuous insulating wall is different from a material of the dielectric layer.

16. The FinFET device of claim 15, wherein the continuous insulating wall comprises silicon oxide, silicon nitride, silicon oxynitride, silicon carbide, copper oxide, nickel oxide, zinc oxide, lanthanum manganese oxide, lanthanum copper oxide or a combination thereof.

17. The FinFET device of claim 15, wherein the continuous insulating wall comprises horizontally stacked layers.

18. The FinFET device of claim 15, wherein the continuous insulating wall is made of a single material.

19. The FinFET device of claim 15, wherein one of the first and second regions is an NMOS region and the other of the first and second regions is a PMOS region.

* * * * *